(12) United States Patent
Kim et al.

(10) Patent No.: US 10,804,145 B2
(45) Date of Patent: Oct. 13, 2020

(54) METHODS OF FABRICATING SEMICONDUCTOR DEVICES

(71) Applicant: Samsung Electronics Co., Ltd., Suwon-si, Gyeonggi-do (KR)

(72) Inventors: Yeong Gil Kim, Hwaseong-gi (KR); Han Seong Kim, Suwon-si (KR); Jong Min Baek, Seoul (KR); Ji Young Kim, Seoul (KR); Sung Bin Park, Suwon-si (KR); Deok Young Jung, Seoul (KR); Kyu Hee Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/545,150

(22) Filed: Aug. 20, 2019

(65) Prior Publication Data

US 2020/0227314 A1 Jul. 16, 2020

(30) Foreign Application Priority Data

Jan. 10, 2019 (KR) ........................ 10-2019-0003248

(51) Int. Cl.
| | |
|---|---|
| *H01L 21/768* | (2006.01) |
| *H01L 23/532* | (2006.01) |
| *H01L 21/311* | (2006.01) |
| *H01L 21/02* | (2006.01) |
| *H01L 23/522* | (2006.01) |

(52) U.S. Cl.
CPC ...... *H01L 21/76835* (2013.01); *H01L 21/022* (2013.01); *H01L 21/02123* (2013.01); *H01L 21/02126* (2013.01); *H01L 21/31144* (2013.01); *H01L 21/76822* (2013.01);

(Continued)

(58) Field of Classification Search
CPC ......... H01L 21/76835; H01L 21/76829; H01L 21/76822; H01L 21/31144; H01L 21/022; H01L 21/02123; H01L 21/02126; H01L 21/02208; H01L 21/31633; H01L 23/53295; H01L 23/53223; H01L 23/53238; H01L 23/498; H01L 23/5226; H01L 23/5329
See application file for complete search history.

(56) References Cited

U.S. PATENT DOCUMENTS 6,485,815 B1 * 11/2002 Jeong ................ H01L 21/02362
428/210
6,913,992 B2   7/2005 Schmitt et al.
(Continued)

*Primary Examiner* — Michael M Trinh
(74) *Attorney, Agent, or Firm* — Myers Bigel, P.A.

(57) ABSTRACT

A method of fabricating a semiconductor device is provided. The method may include forming a first interlayer insulating film on a substrate, forming a second interlayer insulating film on the first interlayer insulating film, and forming a third interlayer insulating film on the second interlayer insulating film. Different amounts of carbon may be present in each of the first, second, and third interlayer insulating films. The third interlayer insulating film may be used as a mask pattern to form a via trench that extends at least partially into the first interlayer insulating film and the second interlayer insulating film. Supplying a carbon precursor may be interrupted between the forming of the second and third interlayer insulating films, such that the second interlayer insulating film and the third interlayer insulating film may have a discontinuous boundary therebetween.

20 Claims, 10 Drawing Sheets

(52) U.S. Cl.
CPC .... *H01L 21/76829* (2013.01); *H01L 23/5226* (2013.01); *H01L 23/53223* (2013.01); *H01L 23/53295* (2013.01)

(56) References Cited

U.S. PATENT DOCUMENTS

| | | |
|---|---|---|
| 7,091,615 B2 | 8/2006 | Andideh et al. |
| 7,208,408 B2 | 4/2007 | Yuasa et al. |
| 7,226,876 B2 | 6/2007 | Schmitt et al. |
| 7,563,728 B2 | 7/2009 | Schmitt et al. |
| 7,811,926 B2 | 10/2010 | Fuller et al. |
| 7,833,901 B2 | 11/2010 | Ohto et al. |
| 7,960,294 B2 | 6/2011 | Schmitt et al. |
| 8,569,166 B2 | 10/2013 | Schmitt et al. |
| 8,994,178 B2 | 3/2015 | Shin et al. |
| 9,520,300 B2 | 12/2016 | You et al. |
| 2006/0255466 A1* | 11/2006 | Ohnishi ............... H01L 21/3122 257/758 |
| 2011/0272813 A1* | 11/2011 | Kume ............... H01L 21/76814 257/758 |
| 2011/0316161 A1* | 12/2011 | Ohtake ............. H01L 21/76808 257/758 |
| 2011/0318926 A1* | 12/2011 | Ito ..................... H01L 21/02203 438/689 |
| 2015/0028491 A1* | 1/2015 | Angyal ............. H01L 21/02126 257/774 |
| 2015/0332955 A1* | 11/2015 | You .................. H01L 21/02126 438/666 |

\* cited by examiner

FIG. 2

| Layer | RI | Si-CH3/SiO(%) | C(%) | K value | Modulus(GPa) |
|---|---|---|---|---|---|
| 4th | 1.46~1.47 | 1.45~1.55 | 10~12 | 3.15~3.25 | 28~30 |
| 3rd | 1.42~1.43 | 3.52~3.62 | 15~17 | 2.75~2.85 | 15~17 |
| 1st | | 1.05~1.15 | 0~2 | 4.2~4.4 | 48~50 |

METHODS OF FABRICATING SEMICONDUCTOR DEVICES

CROSS-REFERENCE TO RELATED APPLICATION

This application claims priority from Korean Patent Application No. 10-2019-0003248, filed on Jan. 10, 2019, in the Korean Intellectual Property Office, the disclosure of which is incorporated by reference herein in its entirety.

TECHNICAL FIELD

The present disclosure relates to methods of fabricating semiconductor devices, and more particularly, to methods of fabricating semiconductor devices using an interlayer insulating film including a low-k dielectric material.

BACKGROUND

As electronic technology has developed, the downscaling of semiconductor devices has progressed rapidly, and increased integration and decreased power consumption of semiconductor chips have been increasingly desired.

In order to meet the increasing desire for semiconductor devices having increased integration and decreased power consumption, a feature size of the semiconductor devices has been reduced, and a dielectric constant k of an intermetal dielectric (IMD) layer in a back end-of-line (BEOL) process has been reduced.

As the feature size of the semiconductor devices is reduced, it may be desirable to improve the resistive capacitance and reliability of a dielectric film disposed between interconnections.

SUMMARY

Aspects of the present disclosure provide methods of fabricating semiconductor devices that may improve a dispersion of interlayer insulating films during a process of forming inter-metal interlayer insulating films, and may improve the reliability and performance of the semiconductor devices.

Aspects of the present disclosure may also provide methods of fabricating semiconductor devices that may prevent damage to interlayer insulating films, and may prevent defects between the interlayer insulating films and vias during a process of forming inter-metal vias, and may improve the performance and reliability of the semiconductor devices.

According to some example embodiments of the present inventive concepts, a method of fabricating a semiconductor device may include forming a first interlayer insulating film on a substrate, the first interlayer insulating film including a first atomic ratio of carbon; forming a second interlayer insulating film on the first interlayer insulating film, the second interlayer insulating film including a second atomic ratio of carbon that is higher than the first atomic ratio; and forming a third interlayer insulating film on the second interlayer insulating film, the third interlayer insulating film including a third atomic ratio of carbon that is higher than the first atomic ratio and lower than the second atomic ratio; The method may further include removing a portion of the third interlayer insulating film and forming a mask pattern that exposes at least a portion of the second interlayer insulating film; forming a via trench using the mask pattern, with the via trench extending at least partially into the first interlayer insulating film and the second interlayer insulating film, and forming a via filling the via trench. Forming the second interlayer insulating film and forming the third interlayer insulating film may be separated by a rest interval such that there is a discontinuous boundary between the second interlayer insulating film and the third interlayer insulating film.

According to an some example embodiments of the present inventive concepts, a method of fabricating a semiconductor device may include forming a first interlayer insulating film on a substrate using a first process for providing a carbon precursor having a first precursor ratio and oxygen ($O_2$), forming a second interlayer insulating film on the first interlayer insulating film using a second process for providing oxygen and a carbon precursor having a second precursor ratio that is higher than the first precursor ratio, forming a third interlayer insulating film on the second interlayer insulating film using a third process for providing oxygen and a carbon precursor having a third precursor ratio that is lower than the second precursor ratio, removing a portion of the third interlayer insulating film and forming a mask pattern that exposes at least a portion of the second interlayer insulating film, forming a via trench using the mask pattern, the via trench at least partially extends into the first interlayer insulating film and the second interlayer insulating film, and forming a via filling the via trench, wherein each of the first to third precursor ratios is a ratio of the carbon precursor to oxygen, the carbon precursor is supplied into a reaction chamber between the first process and the second process, and an interruption of supplying carbon precursor into the reaction chamber occurs between the second process and the third process.

According to an some example embodiments of the present inventive concepts, a method of fabricating a semiconductor device may include forming a first interlayer insulating film on a substrate, the first interlayer insulating film including a first bond ratio of silicon-methyl (Si—CH3) bonds to silicon-oxygen (Si—O) bonds, forming a second interlayer insulating film on the first interlayer insulating film, the second interlayer insulating film including a second bond ratio of Si—CH3 bonds to Si—O bonds that is higher than the first bond ratio, forming a third interlayer insulating film on the second interlayer insulating film, the third interlayer insulating film including a third ratio of Si—CH3 bonds to Si—O bonds that is between the first bond ratio and the second bond ratio, removing a portion of the third interlayer insulating film and forming a mask pattern that exposes at least a portion of the second interlayer insulating film, forming a via trench using the mask pattern, the via trench extending at least partially into the first interlayer insulating film and the second interlayer insulating film, and forming a via filling the via trench, wherein the second bond ratio of the Si—CH3 bonds included in the second interlayer insulating film is discontinuous with the third bond ratio of the Si—CH3 bonds included in the third interlayer insulating film at a boundary between the second interlayer insulating film and the third interlayer insulating film.

It should be noted that aspects of the present disclosure are not limited to those described above, and other aspects of the present disclosure will be apparent to those skilled in the art from the following descriptions.

BRIEF DESCRIPTION OF THE DRAWINGS

The above and other aspects and features of the present disclosure will become more apparent by describing some example embodiments thereof in detail with reference to the attached drawings, in which:

FIG. 2 is a table describing specific examples of properties of interlayer insulating films shown in FIG. 1;

DETAILED DESCRIPTION OF THE EMBODIMENTS

Hereinafter, methods of fabricating semiconductor devices according to some example embodiments of the present disclosure will be described with reference to FIGS. 1 and 2.

Figure 1:
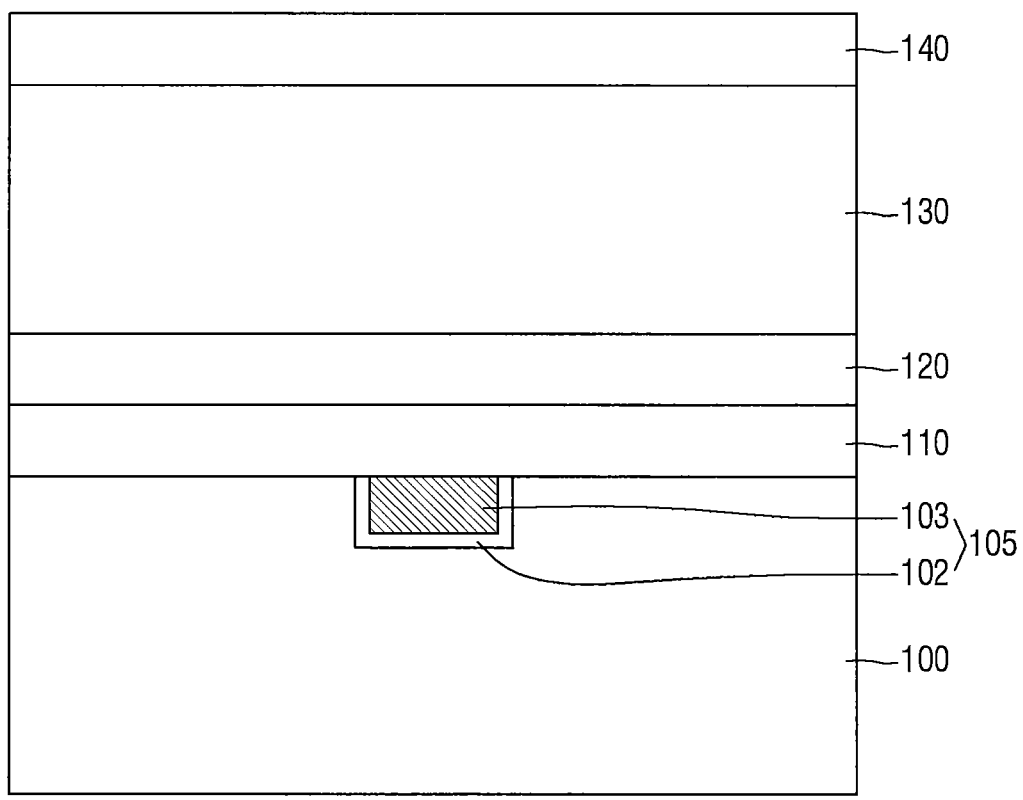
FIG. 1 is a cross-sectional view illustrating a deposition process of an intermediate operation of a method of fabricating a semiconductor device according to some example embodiments of the present disclosure.

FIG. 1 is a cross-sectional view illustrating a deposition process of an intermediate operation of a method of fabricating a semiconductor device according to some example embodiments of the present disclosure. FIG. 2 is a table describing properties of specific examples of interlayer insulating films shown in FIG. 1.

Referring to FIG. 1, a first interlayer insulating film 110, a second interlayer insulating film 120, a third interlayer insulating film 130, and a fourth interlayer insulating film 140 may be sequentially formed on a substrate 100, with the substrate 100 including a lower pattern 105. As described below in detail, the first to fourth interlayer insulating films 110, 120, 130, and 140 may be used to form an inter-metal dielectric (IMD) layer.

Specifically, the lower pattern 105 may be formed in the substrate 100. In some embodiments, the lower pattern 105 may be formed in the substrate 100 prior to the forming of any of the first to fourth interlayer insulating films 110, 120, 130, and 140. The substrate 100 may have a structure in which a base substrate and an epitaxial layer are stacked, but the present disclosure is not limited thereto. The substrate 100 may be a silicon substrate, a gallium arsenide (GaAs) substrate, a silicon germanium (SiGe) substrate, a ceramic substrate, a quartz substrate, a glass substrate for a display, or the like. Further, the substrate 100 may be a semiconductor-on-insulator (SOI) substrate. Hereinafter, a silicon substrate will be taken as an example of the substrate 100. Also, the substrate 100 may be a silicon substrate on which an insulating film is formed.

In the method of fabricating the semiconductor device according to some example embodiments of the present disclosure, it will be assumed for brevity that the lower pattern 105 is a metal interconnection, but the present disclosure is not limited thereto. That is, the lower pattern 105 may be a transistor or a diode formed in the substrate 100. Specifically, the lower pattern 105 may be a gate electrode of the transistor or a source or drain region of the transistor.

The lower pattern 105 included in the substrate 100 may include a conductive material. The lower pattern 105 may include a lower barrier film 102 and a lower interconnection film 103.

The lower interconnection film 103 may include, for instance, aluminum (Al), copper (Cu), tungsten (W), cobalt (Co), or a combination thereof.

The lower barrier film 102 may be formed between the lower interconnection film 103 and the substrate 100. For example, the lower barrier film 102 may be conformally formed along a recess inside the substrate 100. The lower barrier film 102 may be formed on surfaces of the recess inside the substrate 100. The lower barrier film 102 may include, for example, a material such as tantalum (Ta), tantalum nitride (TaN), titanium (Ti), titanium nitride (TiN), ruthenium (Ru), cobalt (Co), nickel (Ni), nickel boron (NiB), and tungsten nitride (WN). Although the lower barrier film 102 is illustrated as a single layer, the lower barrier film 102 may include a plurality of layers.

The first interlayer insulating film 110 may be formed on the substrate 100 which includes the lower pattern 105.

The first interlayer insulating film 110 may include, for example, at least one of silicon nitride (SiN), silicon oxynitride (SiON), and silicon carbonitride (SiCN). The first interlayer insulating film 110 may be formed using, for example, a chemical vapor deposition (CVD) process or an atomic layer deposition (ALD) process.

The first interlayer insulating film 110 may include a low-k dielectric material to reduce a coupling phenomenon between interconnections. For example, the low-k dielectric material may include silicon oxide containing carbon and hydrogen at appropriately high ratios and may include a material such as SiCOH.

Specifically, the low-k dielectric material may include fluorinated tetraethyl orthosilicate (FTEOS), hydrogen silsesquioxane (HSQ), bis-benzocyclobutene (BCB), tetramethyl orthosilicate (TMOS), octamethyleyclotetrasiloxane (OMCTS), hexamethyl disiloxane (HMDS), trimethylsilyl borate (TMSB), diacetoxyditertiarybutosiloxane (DADBS), trimethylsilil phosphate (TMSP), polytetrafluoroethylene (PTFE), tonen silazene (TOSZ), fluoride silicate glass (FSG), polyimide nanofoams (e.g., polypropylene oxide), carbon-doped silicon oxide (CDO), organo silicate glass (OSG), SiLK, amorphous fluorinated carbon, silica aerogels, silica xerogels, mesoporous silica, or a combination thereof, but the present disclosure is not limited thereto.

A first atomic ratio of carbon may be included in the first interlayer insulating film 110. Herein, an atomic ratio of carbon included in an interlayer insulating film may be defined as a ratio of the number of carbon atoms included in the interlayer insulating film relative to the number of all atoms included in the interlayer insulating film. For example, the first atomic ratio of carbon included in the first interlayer insulating film 110 may be a ratio of the number of carbon atoms included in the first interlayer insulating film 110 relative to the number of all atoms included in the first interlayer insulating film 110. In an example, an atomic ratio of carbon in an interlayer insulating film (e.g., the first atomic ratio of the first interlayer insulating film 110) may be measured by a measuring system using X-ray photoelectron spectroscopy (XPS) or the like. For example, X-rays may be irradiated to, or onto, the first interlayer insulating film 110 to detect photoelectrons generated by the first interlayer insulating film 110. The atomic ratio of carbon included in the first interlayer insulating film 110 may be measured using the detected photoelectrons.

For example, referring to FIG. 2, the first atomic ratio of carbon included in the first interlayer insulating film 110 may range from 0% to 2%. However, the present disclosure is not limited thereto.

In the method of fabricating the semiconductor device according to some example embodiments of the present disclosure, the first interlayer insulating film 110 may have a first bond ratio of silicon methyl (Si—CH3) bonds. Herein, a bond ratio of an interlayer insulating film may be defined as a ratio of the number of the Si—H3 bonds included in the interlayer insulating film relative to the number of silicon-oxygen (Si—O) bonds included in the interlayer insulating film. For example, the first bond ratio of the Si—CH3 bonds included in the first interlayer insulating film 110 may be a ratio of the number of the Si—CH3 bonds included in the first interlayer insulating film 110 relative to the number of Si—O bonds included in the first interlayer insulating film 110. In an example, the Si—CH3 ratio of the first interlayer insulating film 110 may be measured using a measuring system such as a Fourier transform infrared (FTIR) spectrometer.

Specifically, referring to FIG. 2, the first bond ratio of the Si—CH3 bonds included in the first interlayer insulating film 110 may range from 1.05% to 1.15%. However, the present disclosure is not limited thereto.

Meanwhile, properties of the first interlayer insulating film 110 may be determined by a carbon content and/or a Si—CH3 bond ratio of the first interlayer insulating film 110. When the carbon content and/or a Si—CH3 bond ratio is increased in an interlayer insulating film, the number of pores generated due to carbon or a methyl group may be increased in the interlayer insulating film.

For example, the generated pores may be formed as vacant spaces having a low dielectric constant. That is, the interlayer insulating film may be a porous film or a porous layer according to the carbon content and/or the Si—CH3 bond ratio.

Accordingly, when the carbon content or the Si—CH3 bond of the interlayer insulating film is increased, a dielectric constant (i.e., k value) of the interlayer insulating film may be reduced. Further, when the carbon content or the Si—CH3 bond of the interlayer insulating film is increased, a Young's modulus of the interlayer insulating film may be reduced.

For example, the first interlayer insulating film 110 may include a carbon content having a relatively low ratio as compared with a carbon content of other insulating films, such as the third interlayer insulating film 130. Accordingly, a dielectric constant of the first interlayer insulating film 110 may be higher than that of the third interlayer insulating film 130 described below. In a specific example, referring to FIG. 2, the first interlayer insulating film 110 may have a k value of 4.2 to 4.4. However, the present disclosure is not limited thereto.

For example, when the first interlayer insulating film 110 includes carbon having a low ratio, a Young's modulus of the first interlayer insulating film 110 may be increased. In a specific example, the first interlayer insulating film 110 may have a Young's modulus of 48 GPa to 50 GPa. However, the present disclosure is not limited thereto.

As described above, the first interlayer insulating film 110 may have the first atomic ratio of carbon and the first bond ratio of Si—CH3 bonds, which are lower than those of the third interlayer insulating film 130 described below, and thus, the first interlayer insulating film 110 may have a Young's modulus higher than that of the third interlayer insulating film 130. Accordingly, the first interlayer insulating film 110 may be used as an initial dielectric film or an initial layer when the second to fourth interlayer insulating film 120 to 140 are deposited. In addition, the first interlayer insulating film 110 may be used as an etch stop layer when portions of the second interlayer insulating film and the third interlayer insulating film 130 are etched.

A thickness of the first interlayer insulating film 110 may be smaller than that of the third interlayer insulating film 130. For example, the thickness of the first interlayer insulating film 110 may refer to a distance from a top surface of the substrate 100 to a top surface of the first interlayer insulating film 110. Further, the thickness of the third interlayer insulating film 130 may refer to a distance from a top surface of the second interlayer insulating film 120 to a top surface of the third interlayer insulating film 130. As described above, a dielectric constant of the first interlayer insulating film 110 may be higher than that of the third interlayer insulating film 130. Accordingly, as the thickness of the first interlayer insulating film 110 is reduced, the total dielectric constant of the IMD layer may be reduced. In a specific example, the first interlayer insulating film 110 may have a thickness of 1 nm to 5 nm. However, the present disclosure is not limited thereto.

The second interlayer insulating film 120 may be formed on the first interlayer insulating film 110. The second interlayer insulating film 120 may be a transition dielectric film or a transition layer, which is formed between the first interlayer insulating film 110 and the third interlayer insulating film 130. In a specific example, the second interlayer insulating film 120 may be a transition dielectric film or a transition layer, which is generated to consecutively form the first interlayer insulating film 110 and the third interlayer insulating film 130.

A second atomic ratio of carbon may be included in the second interlayer insulating film 120. The second atomic ratio of carbon in the second interlayer insulating film 120 may be continuously changed from the first atomic ratio of carbon included in the first interlayer insulating film 110 to a third atomic ratio of carbon included in the third interlayer insulating film 130. For example, the second atomic ratio of carbon included in the second interlayer insulating film 120 may be continuously changed from the first atomic ratio at a boundary between the first interlayer insulating film 110 and the second interlayer insulating film 120. In addition, the second atomic ratio of carbon included in the second interlayer insulating film 120 may be continuously changed from the third atomic ratio at a boundary between the second interlayer insulating film 120 and the third interlayer insulating film 130. In some example embodiments of the present disclosure, a carbon content of a first portion of the second interlayer insulating film 120 that is relatively proximate to the third interlayer insulating film 130 may be greater than a carbon content of a second portion of the second interlayer insulating film 120 that is relatively proximate to the first interlayer insulating film 110. The carbon content of the second interlayer insulating film 120 may be variable over a thickness of the second interlayer insulating film 120. In some example embodiments of the present disclosure, an average of the second atomic ratio of carbon included in the second interlayer insulating film 120 may be an average of the first atomic ratio and the third atomic ratio.

The second interlayer insulating film 120 may have a second bond ratio of Si—CH3 bonds. The second bond ratio of the Si—CH3 bonds included in the second interlayer insulating film 120 may be continuously changed from the first bond ratio of the Si—CH3 bonds included in the first interlayer insulating film 110 to the third bond ratio of the Si—CH3 bonds included in the third interlayer insulating film 130. For example, the second bond ratio of the Si—CH3 bonds included in the second interlayer insulating film 120 may be continuously changed from the first bond ratio at the boundary between the first interlayer insulating film 110 and the second interlayer insulating film 120. In addition, the second bond ratio of the Si—CH3 bonds included in the second interlayer insulating film 120 may be continuously changed from the third bond ratio at the boundary between the second interlayer insulating film 120 and the third interlayer insulating film 130. In some example embodiments of the present disclosure, a number of Si—CH3 bonds present in a first portion of the second interlayer insulating film 120 that is relatively proximate to the third interlayer insulating film 130 may be greater than a number of Si—CH3 bonds present in a second portion of the second interlayer insulating film 120 that is relatively proximate to the first interlayer insulating film 110. The number of Si—CH3 bonds in the second interlayer insulating film 120 may be variable over a thickness of the second interlayer insulating film 120. In some example embodiments of the present disclosure, an average of the second bond ratio of the Si—CH3 bonds included in the second interlayer insulating film 120 may be an average of the first bond ratio and the third bond ratio.

The third interlayer insulating film 130 may be formed on the second interlayer insulating film 120. As described above, the second interlayer insulating film 120 may be a transition dielectric film or a transition layer, which may be generated to consecutively form the first interlayer insulating film 110 and the third interlayer insulating film 130. Accordingly, the third interlayer insulating film 130 may be interpreted as being formed on the first interlayer insulating film 110. Further, the third interlayer insulating film 130 may be formed immediately after the first interlayer insulating film 110 and the second interlayer insulating film 120 are formed.

The third interlayer insulating film 130 may include at least one of silicon nitride (SiN), silicon oxynitride (SiON), silicon carbonitride (SiCN), and a low-k dielectric material. The third interlayer insulating film 130 may be formed using, for example, a CVD process, an ALD process, or the like. Like the first interlayer insulating film 110, a ratio of carbon included in the third interlayer insulating film 130 may be measured by a measuring unit using XPS or the like. Furthermore, a Si—CH3 bond ratio of the third interlayer insulating film 130 may be measured using a measuring system such as an FTIR spectrometer.

A third atomic ratio of carbon may be included in the third interlayer insulating film 130. In the method of fabricating the semiconductor device according to some example embodiments of the present disclosure, the third atomic ratio of carbon included in the third interlayer insulating film 130 may be different from the first atomic ratio of carbon included in the first interlayer insulating film 110. In a specific example, the third atomic ratio of carbon included in the third interlayer insulating film 130 may be higher than the first atomic ratio of carbon included in the first interlayer insulating film 110.

For example, referring to FIG. 2, the third atomic ratio of carbon included in the third interlayer insulating film 130 may range from 15% to 17%. However, the present disclosure is not limited thereto.

The third interlayer insulating film 130 may have a third bond ratio of Si—CH3 bonds. In the method of fabricating the semiconductor device according to some example embodiments of the present disclosure, the third bond ratio of the Si—CH3 bonds included in the third interlayer insulating film 130 may be different from the first bond ratio of the Si—CH3 bonds included in the first interlayer insulating film 110. In a specific example, the third bond ratio of the Si—CH3 included in the third interlayer insulating film 130 may be higher than the third bond ratio of the Si—CH3 bonds included in the first interlayer insulating film 110.

For example, referring to FIG. 2, the first atomic ratio of carbon included in the third interlayer insulating film 130 may range from 3.52% to 3.62%. However, the present disclosure is not limited thereto.

As described above, the third interlayer insulating film 130 may have a carbon atomic ratio and a Si—CH3 bond ratio that are higher than those of the first interlayer insulating film 110. Accordingly, the third interlayer insulating film 130 may have a larger number of pores than the first interlayer insulating film 110.

That is, the third interlayer insulating film 130 may have a low dielectric constant. In a specific example, referring to FIG. 2, the third interlayer insulating film 130 may have a k value of 2.75 to 2.85. However, the present disclosure is not limited thereto.

The third interlayer insulating film 130 may have a low Young's modulus. In a specific example, referring to FIG. 2, the third interlayer insulating film 130 may have a Young's modulus of 15 GPa to 17 GPa. However, the present disclosure is not limited thereto.

The third interlayer insulating film 130 may have a low refractive index (RI). In a specific example, referring to FIG. 2, the third interlayer insulating film 130 may have an RI of 1.42 to 1.43. However, the present disclosure is not limited thereto.

As described above, since the third interlayer insulating film 130 may have a lower dielectric constant than the first interlayer insulating film 110, the third interlayer insulating film 130 may include a bulk dielectric film or a bulk layer to reduce a coupling phenomenon between interconnections. For example, as a percentage occupied by the third interlayer insulating film 130 of the first to third interlayer insulating films 110 to 130 increases, the total dielectric constant between interconnections may be reduced. Further, as a height of the second interlayer insulating film 120 formed between the first interlayer insulating film 110 and the third interlayer insulating film 130 is reduced, the percentage occupied by the third interlayer insulating film 130 of the first to third interlayer insulating films 110 to 130 may increase, and thus, the total dielectric constant between the interconnections may be reduced.

That is, a thickness of the third interlayer insulating film 130 may be greater than that of each of the first and second interlayer insulating films 110 and 120. For example, the third interlayer insulating film 130 may have a thickness of 5 nm or more. For example, the thickness of the third interlayer insulating film 130 may depend on various factors such as process parameters and process equipment.

The fourth interlayer insulating film 140 may be formed on the third interlayer insulating film 130. The third interlayer insulating film 130 and the fourth interlayer insulating film 140 may not be formed consecutively. The fourth interlayer insulating film 140 may be used as a mask for the etching of the third interlayer insulating film 130. For example, a portion of the fourth interlayer insulating film 140 may be removed to form a mask pattern. Since the fourth interlayer insulating film 140 is removed in a subsequent process, the first to third interlayer insulating films 110 to 130 may be consecutively formed, while the third interlayer insulating film 130 and the fourth interlayer insulating film 140 may not be consecutively formed. In some example embodiments of the present disclosure, the first to third interlayer insulating films 110 to 130 may be formed during a continuous process, or consecutive processes with no time interval therebetween, and the fourth interlayer insulating film 140 may be formed subsequent to the formation of the third interlayer insulating film 130 and subsequent to an interval of time after completion of the formation of the third interlayer insulating film 130.

In the method of fabricating the semiconductor device according to some example embodiments of the present disclosure, since the third interlayer insulating film 130 and the fourth interlayer insulating film 140 are not consecutively formed, a transition layer may not be generated between the third interlayer insulating film 130 and the fourth interlayer insulating film 140.

If the transition layer is generated between the third interlayer insulating film 130 and the fourth interlayer insulating film 140, the total height of the first to fourth interlayer insulating films 110, 120, 130, and 140 may be increased. However, since the third interlayer insulating film 130 and the fourth interlayer insulating film 140 are not formed consecutively, a height of the IMD layer that is finally formed according to the method of fabricating the semiconductor device according to some example embodiments of the present disclosure may be reduced. In an example, the height of the IMD layer may be 1000 Å or less. In another example, the height of the IMD layer may be 500 Å or less. However, the present disclosure is not limited thereto.

The fourth interlayer insulating film 140 may include at least one of silicon nitride (SiN), silicon oxynitride (SiON), silicon carbonitride (SiCN), and a low-k dielectric material. The fourth interlayer insulating film 140 may be formed using, for example, a CVD process, an ALD process, or the like. A ratio of carbon included in the fourth interlayer insulating film 140 may be measured by a measuring unit using XPS or the like. In addition, a Si—CH3 bond ratio of the fourth interlayer insulating film 140 may be measured using a measuring system such as an FTIR spectrometer or the like.

A fourth atomic ratio of carbon may be included in the fourth interlayer insulating film 140. In the method of fabricating the semiconductor device according to some example embodiments of the present disclosure, the fourth atomic ratio of carbon included in the fourth interlayer insulating film 140 may be different from the first atomic ratio of carbon included in the first interlayer insulating film 110 and the third atomic ratio of carbon included in the third interlayer insulating film 130. In a specific example, the fourth atomic ratio of carbon included in the fourth interlayer insulating film may be higher than the first atomic ratio of carbon included in the first interlayer insulating film 110 and lower than the third atomic ratio of carbon included in the third interlayer insulating film 130.

In a specific example, referring to FIG. 2, the fourth atomic ratio of carbon included in the fourth interlayer insulating film 140 may range from 10% to 12%. However, the present disclosure is not limited thereto.

The fourth interlayer insulating film 140 may have a fourth bond ratio of Si—CH3 bonds. In the method of fabricating the semiconductor device according to some example embodiments of the present disclosure, a fourth bond ratio of Si—CH3 bonds included in the fourth interlayer insulating film 140 may be different from the first bond ratio of Si—CH3 bonds included in the first interlayer insulating film 110 and the third bond ratio of Si—CH3 bonds included in the third interlayer insulating film 130. In a specific example, the fourth bond ratio of the Si—CH3 bonds included in the fourth interlayer insulating film 140 may be higher than the first bond ratio of the Si—CH3 bonds included in the first interlayer insulating film 110 and lower than the third bond ratio of the Si—CH3 bonds included in the third interlayer insulating film 130.

In a specific example, referring to FIG. 2, the fourth bond ratio of the Si—CH3 bonds included in the fourth interlayer insulating film 140 may range from 1.45% to 1.55%. However, the present disclosure is not limited thereto.

As described above, the fourth interlayer insulating film 140 may have a carbon atomic ratio and a Si—CH3 bond ratio that are higher than those of the first interlayer insulating film 110 and lower than those of the third interlayer insulating film 130. The number of pores of the fourth interlayer insulating film 140 may be smaller than the number of pores of the third interlayer insulating film 130. The fourth interlayer insulating film 140 may have a porous structure denser than that of the third interlayer insulating film 130. The fourth interlayer insulating film 140 may be used to prevent or reduce the penetration of metals into the third interlayer insulating film 130 during a physical vapor deposition (PVD) process.

In addition, the fourth interlayer insulating film 140 may have a dielectric constant that is lower than that of the first interlayer insulating film 110 and higher than that of the third interlayer insulating film 130. In a specific example, referring to FIG. 2, a k value of the fourth interlayer insulating film 140 may range from 3.15 to 3.25. However, the present disclosure is not limited thereto.

The fourth interlayer insulating film 140 may have a Young's modulus which is lower than that of the first interlayer insulating film 110 and higher than that of the third interlayer insulating film 130. In a specific example, referring to FIG. 2, the fourth interlayer insulating film 140 may have a Young's modulus of 28 GPa to 30 GPa. However, the present disclosure is not limited thereto.

Furthermore, the fourth interlayer insulating film 140 may have an RI similar to that of the third interlayer insulating film 130. Specifically, for instance, referring to FIG. 2, the fourth interlayer insulating film 140 is illustrated as having an RI value of 1.46 to 1.47, but the present disclosure is not limited thereto.

As described above, the RI of the fourth interlayer insulating film 140 may be similar (e.g., substantially equal) to that of the third interlayer insulating film 130. That is, an etching rate of the fourth interlayer insulating film 140 may be similar to that of the third interlayer insulating film 130. Accordingly, as described below with reference to FIG. 6, the occurrence of a kink may be prevented or reduced between the fourth interlayer insulating film 140 and the third interlayer insulating film 130. A kink may refer to a portion of a side surface of a via trench that is concavely recessed in a direction extending outward from the inside of the via trench.

The fourth interlayer insulating film 140 may have a sufficient thickness to be used as a hard mask. For example, the fourth interlayer insulating film 140 may have a thickness of 12 nm to 17 nm. However, the present disclosure is not limited thereto.

Hereinafter, a process of forming the first to fourth interlayer insulating films 110 to 140 shown in FIG. 1 will be described in detail with reference to FIG. 3.

Figure 3:
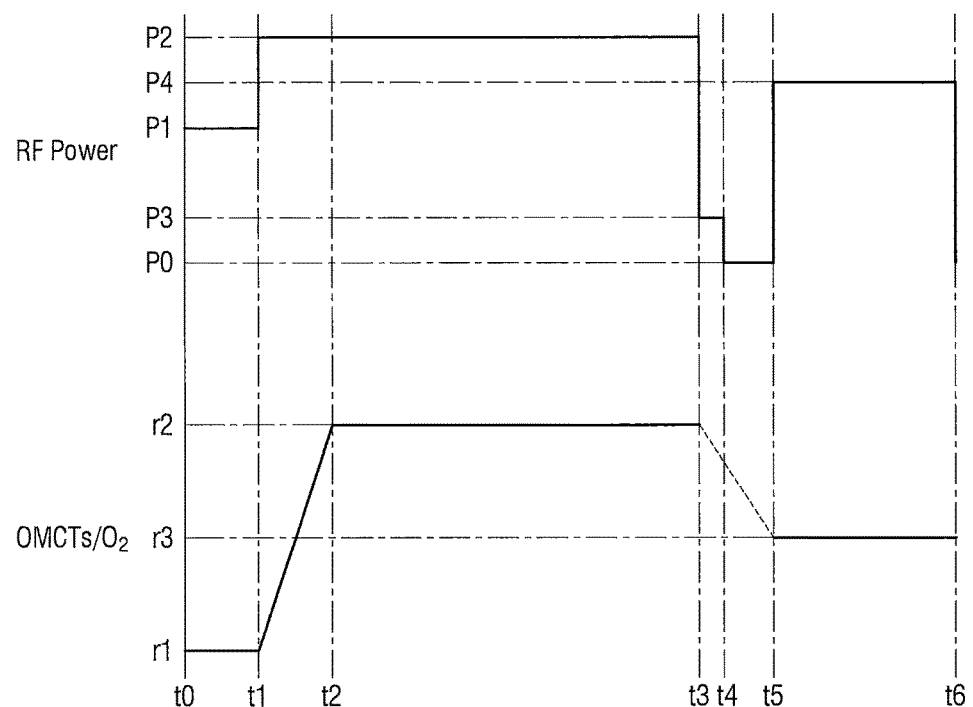
FIG. 3 is a chart illustrating ratios of a carbon precursor provided over a time period to form the interlayer insulating films shown in FIG. 1, and radio-frequency (RF) power provided over the time period by a dual frequency generator.

FIG. 3 is a chart illustrating ratios of a carbon precursor provided over a time period to form the interlayer insulating films shown in FIG. 1, and radio-frequency (RF) power provided over the time period by a dual frequency generator. For reference, FIG. 3 shows a ratio (e.g., OMCTs/O2) of the carbon precursor to the concentration of oxygen gas provided to a reaction chamber. For example, a precursor provider may supply a carbon precursor having a specific ratio and oxygen gas into the reaction chamber. Further, FIG. 3 illustrates RF power of a plasma generator. For example, the plasma generator may be a dual frequency plasma generator.

The dual frequency plasma generator may generate plasma using an electric field of a first frequency. For example, when the electric field of the first frequency is applied to the reaction chamber, part of the carbon precursor and part of the oxygen gas provided to the reaction chamber may be radicalized. In some example embodiments, the first frequency may be a high frequency (HF).

The dual frequency plasma generator may generate an electric field of a second frequency which is lower than the first frequency and facilitate the deposition of the radicalized precursor on a substrate. For example, when the electric field of the second frequency is provided, kinetic energy of the radicalized precursor may be increased to increase a deposition rate. The deposition rate may refer to a deposited height of the interlayer insulating film relative to amounts of the carbon precursor and the oxygen gas provided to the reaction chamber during a unit time. In some example embodiments, the second frequency may be a low frequency (LF).

The dual frequency plasma generator may adjust HF power for generating an electric field of the first frequency or the HF, and may adjust LF power for generating an electric field of the second frequency or the LF. For example, the dual frequency plasma generator may adjust a ratio of HF power to LF power (HF power/LF power ratio) and adjust deposition rates of the first to fourth interlayer insulating films 110, 120, 130, and 140.

In some example embodiments of the present disclosure, the RF power of the dual frequency plasma generator may be the sum of LF power and HF power. For brevity, only RF power is illustrated over a time period from time t0 to time t6 of FIG. 3. An HF power/LF power ratio may be changed within different intervals (e.g., from time t0 to time t1) of the time period from time t0 to time t6.

Referring to FIG. 3, in a first interval from time t0 to time t1, a first process of providing a carbon precursor having a first precursor ratio r1 and oxygen (O2) gas into the reaction chamber may be performed. For example, the precursor provider may provide the carbon precursor having the first precursor ratio r1 and the oxygen gas into the reaction chamber. In this case, a precursor ratio may refer to a ratio of a molecular number of the carbon precursor to a molecular number of the oxygen gas. In some example embodiments of the present disclosure, the carbon precursor may include OMCTS. In a specific example, the first precursor ratio r1 provided in the first process may range from 0.5 to 0.7. However, the present disclosure is not limited thereto.

The carbon precursor and the oxygen gas provided due to the first process may be radicalized by the plasma generator. The radicalized carbon precursor and oxygen gas may be deposited on the substrate 100 at a deposition rate that is adjusted by the plasma generator. Accordingly, the first interlayer insulating film 110 may be formed due to the first process.

For example, in the first process, the plasma generator may use a first RF power P1. Further, in the first process, an HF power/LF power ratio may range from 4 to 5. However, the present disclosure is not limited thereto.

The first process may adjust a ratio of the carbon precursor provided to the reaction chamber and adjust a first atomic ratio of carbon included in the first interlayer insulating film 110. Further, the first process may adjust HF power and LF power of the dual frequency plasma generator and adjust the deposition rate of the first interlayer insulating film 110.

Referring to FIG. 3, in a second interval from time t1 to time t2, a second process for increasing a ratio of a carbon precursor provided to the reaction chamber may be performed. The second process may be a ramping process for increasing the ratio of the carbon precursor. For example, due to the second process, the ratio of the carbon precursor provided to the reaction chamber may increase from the first precursor ratio r1 to a second precursor ratio r2. In a specific example, the precursor provider may continuously increase the ratio of the carbon precursor supplied into the reaction chamber.

The carbon precursor and oxygen gas provided due to the second process may be radicalized due to the plasma generator. The radicalized carbon precursor and oxygen gas may be deposited on the first interlayer insulating film 110 at a deposition rate that is adjusted by the plasma generator. Accordingly, the second interlayer insulating film 120 may be formed due to the second process. For example, in the second process, the plasma generator may use second RF power P2.

Since the second interlayer insulating film 120 is formed, a ratio of the carbon precursor provided to the reaction chamber may be increased. As the second interlayer insulating film 120 increases in thickness and a deposition surface becomes farther away from the first interlayer insulating film 110, a second atomic ratio of carbon included in the second interlayer insulating film 120 may gradually increase. For example, the second atomic ratio of carbon included in the second interlayer insulating film 120 may be continuously increased from the first atomic ratio of carbon included in the first interlayer insulating film 110 to a third atomic ratio of carbon included in the third interlayer insulating film 130.

Referring to FIG. 3, in a third interval from time t2 to time t3, a third process for providing a carbon precursor having the second precursor ratio r2 and oxygen gas to the reaction chamber may be performed. For example, the precursor provider may provide the carbon precursor having the second precursor ratio r2 and the oxygen gas to the reaction chamber. In a specific example, the second precursor ratio r2 of the carbon precursor provided in the third process may range from 21 to 23. However, the present disclosure is not limited thereto.

The carbon precursor and the oxygen gas provided due to the third process may be radicalized by the plasma generator. The radicalized carbon precursor and oxygen gas may be deposited on the second interlayer insulating film 120 at a deposition rate that is adjusted by the plasma generator. Accordingly, the third interlayer insulating film 130 may be formed due to the third process.

For example, in the third process, the plasma generator may use second RF power P2. Further, in the second process, an HF power/LF power ratio may range from 8.3 to 9.2. However, the present disclosure is not limited thereto.

As described above, the second precursor ratio r2 of the carbon precursor provided to the reaction chamber in the third process may be higher than the first precursor ratio r1. Accordingly, the third atomic ratio of carbon included in the third interlayer insulating film 130 may be higher than the first atomic ratio.

Referring to FIG. 3, in a fourth interval from time t3 to time t4, and in a fifth interval from time t4 to time t5, a fourth process for interrupting the providing of the carbon precursor and the oxygen gas to the reaction chamber may be performed. For example, the precursor provider may not inject the carbon precursor and the oxygen gas into the reaction chamber in the fourth process. The precursor provider may bypass the carbon precursor and the oxygen gas through a bypass line connected to the outside of the reaction chamber. Further, the precursor provider may reduce a precursor ratio of the carbon precursor and the oxygen gas that are bypassed through the bypass line during the fourth process. For example, during the fourth process, the precursor provider may reduce the precursor ratio of the carbon precursor and the oxygen gas, which are bypassed through the bypass line, from the second precursor ratio r2 to a third precursor ratio r3. Accordingly, the third precursor ratio r3 of the carbon precursor and the oxygen gas, which are provided to the reaction chamber, may be discontinuous with the second precursor ratio r2 during a fifth process described below.

In the fourth process, since the carbon precursor and the oxygen gas are not provided to the reaction chamber, new radicals may not be generated in the reaction chamber.

For example, at time t3, the radicalized carbon precursor and oxygen gas may remain in the reaction chamber due to the first to third processes.

In addition, in the fourth interval from time t3 to time t4, the radicalized carbon precursor and oxygen gas, which remain in the reaction chamber, may be deposited as a part of the third interlayer insulating film 130. The plasma generator may use third RF power P3 to deposit the radicalized carbon precursor and oxygen gas which remain in the reaction chamber. In a specific example, the plasma generator may only generate an LF electric field due to LF power and assist in the deposition of part of the radicalized carbon precursor and oxygen in the reaction chamber.

Furthermore, in the fifth interval from time t4 to time t5, the plasma generator may not generate an electric field. For example, the plasma generator may use basic RF power P0. The basic RF power PO may be 0.

As described above, in the fifth interval from time t4 to time t5, the third interlayer insulating film 130 may not be formed. That is, the fifth interval from time t4 to time t5 may be a rest period between the process of forming the third interlayer insulating film 130 and the process of forming the fourth interlayer insulating film.

Referring to FIG. 3, in a sixth interval from time t5 to time t6, the fifth process for providing a carbon precursor having the third precursor ratio r3 and the oxygen gas to the reaction chamber may be performed. For example, the precursor provider may provide the carbon precursor having the third precursor ratio r3 and the oxygen gas to the reaction chamber. In a specific example, the third precursor ratio r3 provided in the first process may range from 4.4 to 5.4, but the present disclosure is not limited thereto.

The carbon precursor and the oxygen gas provided due to the fifth process may be radicalized by the plasma generator. Further, the radicalized carbon precursor and oxygen gas may be deposited on the third interlayer insulating film 130 at a deposition rate that is adjusted by the plasma generator. Accordingly, the fourth interlayer insulating film 140 may be formed due to the fifth process.

For example, in the fifth process, the plasma generator may use fourth RF power P4. In a specific example, in the second process, an HF power/LF power ratio may range from 4.4 to 5.4. However, the present disclosure is not limited thereto.

As described above, since the third precursor ratio r3 of the carbon precursor provided into the reaction chamber in the fifth process is higher than the first precursor ratio r1 and lower than the second precursor ratio r2, a fourth atomic ratio of carbon included in the fourth interlayer insulating film 140 may be higher than the first atomic ratio and lower than the third atomic ratio.

According to some example embodiments of the present disclosure, each of the first to fifth processes may adjust a ratio of the carbon precursor provided to the reaction chamber (i.e., a ratio of the carbon precursor to oxygen gas) and a power ratio of the dual frequency plasma generator (i.e., an HF power/LF power ratio) and improve a dispersion of the first to fourth interlayer insulating films 110, 120, 130, and 140. A thickness of the first to fourth interlayer insulating films 110, 120, 130, and 140 may refer to a height from a top surface of the substrate 100 to a top surface of the fourth interlayer insulating film 140. For example, the dispersion of the first to fourth interlayer insulating films 110, 120, 130, and 140 may be defined as a value obtained by dividing a difference between a maximum thickness and minimum thickness of the first to fourth interlayer insulating films 110, 120, 130, and 140 by an average thickness of the first to fourth interlayer insulating films 110, 120, 130, and 140. In a specific example, the first to fourth interlayer insulating films 110, 120, 130, and 140 may have a dispersion of 2.8% to 4.0%. However, the present disclosure is not limited thereto.

According to some example embodiments of the present disclosure, the first to fifth processes for forming the first to fourth interlayer insulating films 110, 120, 130, and 140 may be performed in-situ. In other words, the first to fifth processes may be consecutively performed in the same reaction chamber.

Figure 4:
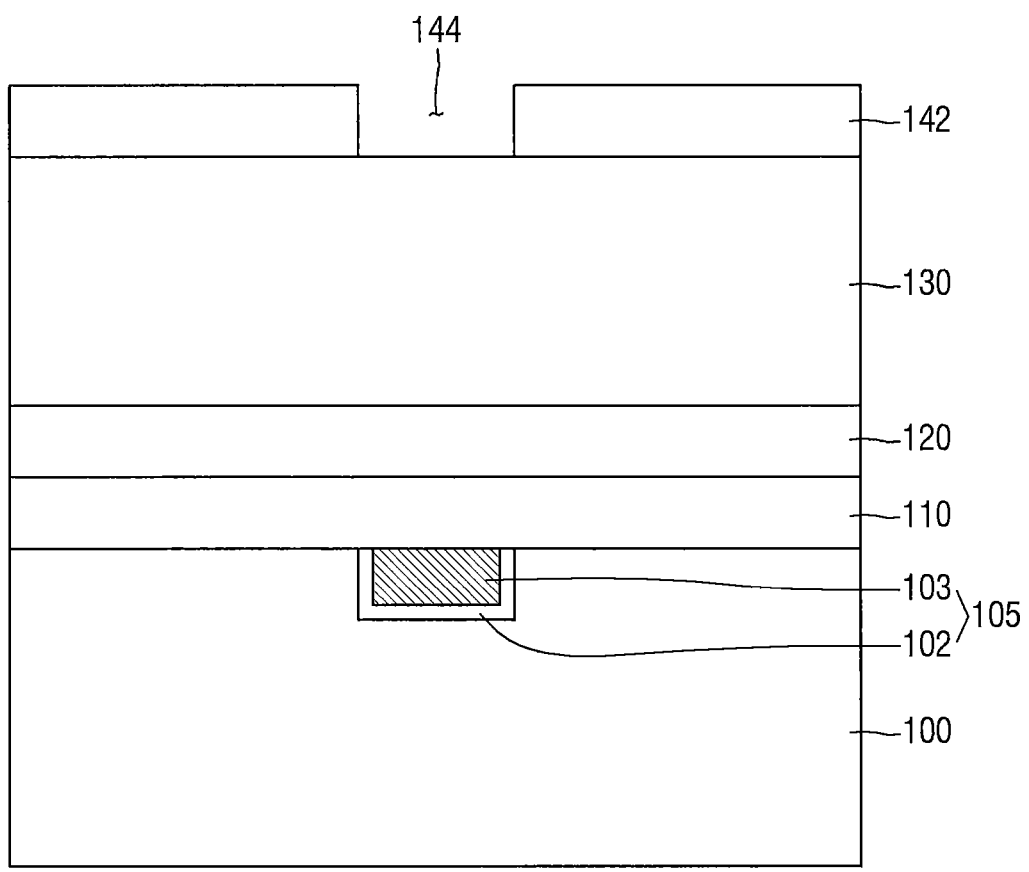
FIG. 4 is a cross-sectional view illustrating an etching process of a method of fabricating a semiconductor device according to some example embodiments of the present disclosure.
Figure 5:
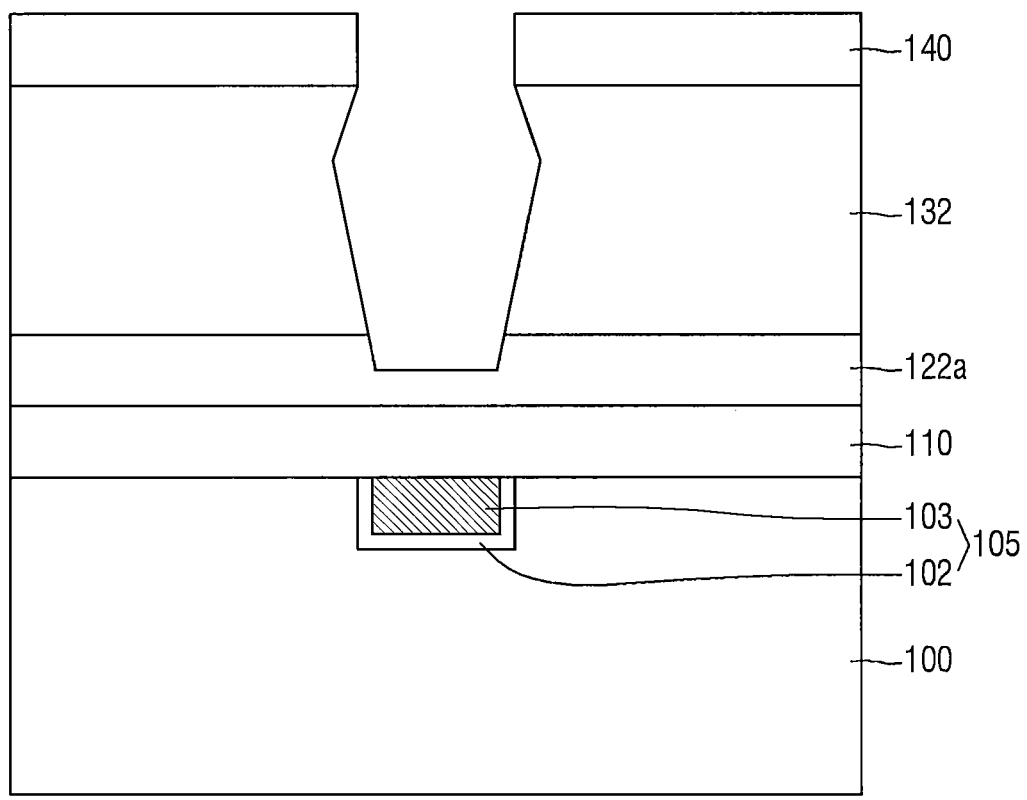
FIG. 5 is a cross-sectional view illustrating a process of etching a portion of a second interlayer insulating film and a third interlayer insulating film shown in FIG. 1 and forming a via trench.
Figure 6:
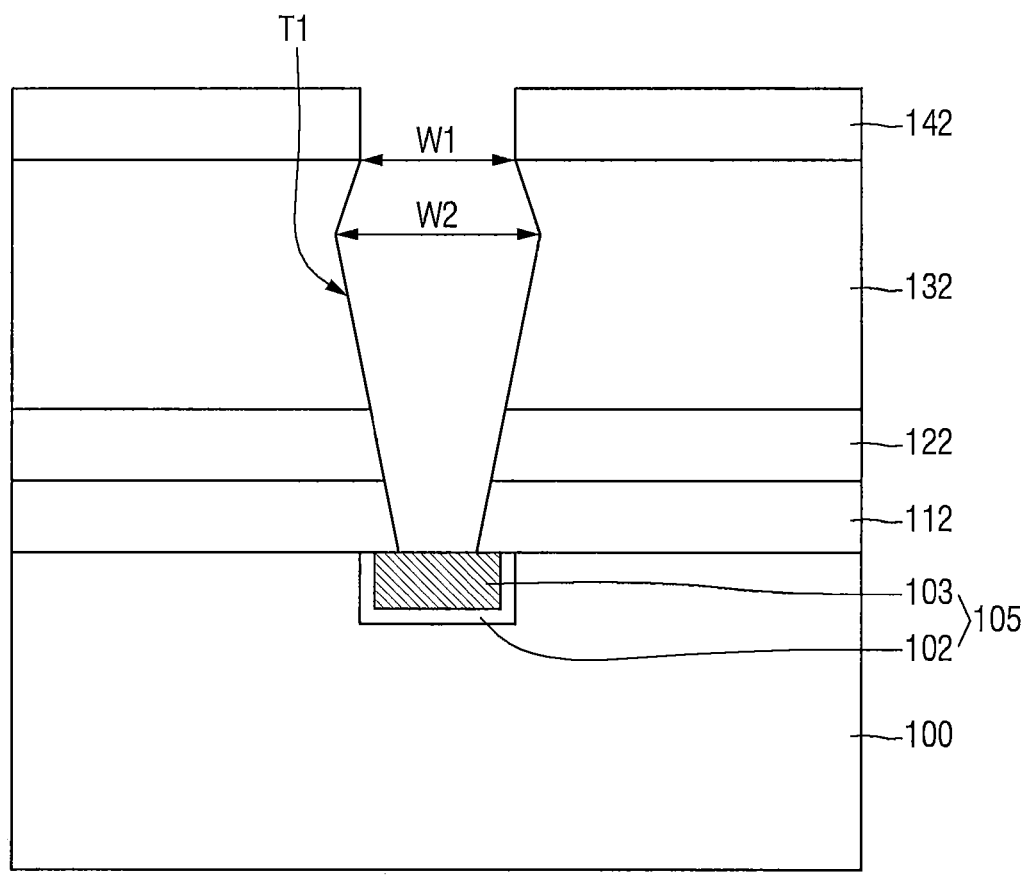
FIG. 6 is a cross-sectional view illustrating a process of etching portions of a first interlayer insulating film and the second interlayer insulating film shown in FIG. 1 and forming a via trench.

Hereinafter, an etching process in a method of fabricating a semiconductor device according to some example embodiments of the present disclosure will be described with reference to FIGS. 4 to 6. FIGS. 4 to 6 are cross-sectional views illustrating an etching process of a method of fabricating a semiconductor device according to some example embodiments of the present disclosure.

Referring to FIG. 4, a portion of the fourth interlayer insulating film 140 may be removed to form a mask pattern 142 exposing a portion of the third interlayer insulating film 130. For example, the mask pattern 142 may include an opening 144 exposing the portion of the third interlayer insulating film 130. The mask pattern 142 may include the remaining portion of the fourth interlayer insulating film 140. For example, the portion of the fourth interlayer insulating film 140 may be removed using a process such as a photolithography process.

Referring to FIG. 5, a portion of the second interlayer insulating film 120 and a portion of the third interlayer insulating film 130 may be removed, thereby forming a second interlayer insulating pattern 122a and a third interlayer insulating pattern 132. The second interlayer insulating pattern 122a and the third interlayer insulating pattern 132 may surround a portion of a via trench. For example, the portion of the second interlayer insulating film 120 and the portion of the third interlayer insulating film 130 may be etched using a dry etching process or a wet etching process. In an example, the second interlayer insulating film 120 may include an upper portion having an etching rate similar to that of the third interlayer insulating film 130 and a lower portion having an etching rate similar to that of the first interlayer insulating film 110. For instance, an upper portion of the second interlayer insulating film 120 may be etched together with the third interlayer insulating film 130.

Referring to FIG. 6, a portion of the first interlayer insulating film 110 and a portion of the second interlayer insulating film 120 may be removed, thereby forming a first interlayer insulating pattern 112 and a second interlayer insulating pattern 122. For example, a lower portion of the second interlayer insulating film 120 may be etched together with the first interlayer insulating film 110. The first interlayer insulating pattern 112 and the second interlayer insulating pattern 122 may surround a portion of a via trench T1. That is, the via trench T1 may be surrounded by the first interlayer insulating pattern 112, the second interlayer insulating pattern 122, the third interlayer insulating pattern 132, and the mask pattern 142.

The method of fabricating the semiconductor device according to some example embodiments of the present disclosure may prevent or reduce the occurrence of a kink in a sidewall of the via trench T1. The kink may refer to a portion of the sidewall of the via trench T1 that is curved outward from the via trench T1. In some example embodiments of the present disclosure, a size of the kink may be defined as a value obtained by dividing a difference between a distance W1 and a distance W2 by 2 (e.g., (W2−W1)/2). Here, the distance W1 may be a distance between both sidewalls at an entrance of the via trench T1, and the distance W2 may be a maximum distance between the both sidewalls of the via trench T1.

When a kink occurs, pores may be formed during a process of forming a first metal film 210 described below with reference to FIG. 7. For example, metal particles to be sputtered may not completely fill a kink formed in the sidewall of the via trench T1. Accordingly, pores may be formed between the sidewall of the via trench T1 and the first metal film 210. When the pores are formed, the lifetime of the entire semiconductor device may be greatly affected.

However, in the method of fabricating the semiconductor device according to the present disclosure, the fourth interlayer insulating film 140 having an etching rate (or RI) similar to that of the third interlayer insulating film 130 may be used as a mask, thereby preventing or reducing the occurrence of the kink. For example, the kink formed in the third interlayer insulating film 130 may have a size of 0.3 nm or less. In a specific example, the kink formed in the third interlayer insulating film 130 according to some example embodiments of the present disclosure may have a size of 0.28 nm or less.

Hereinafter, according to a method of fabricating a semiconductor device according to some example embodiments of the present disclosure, a process of forming a via will be described with reference to FIGS. 7 to 10.

Figure 7:
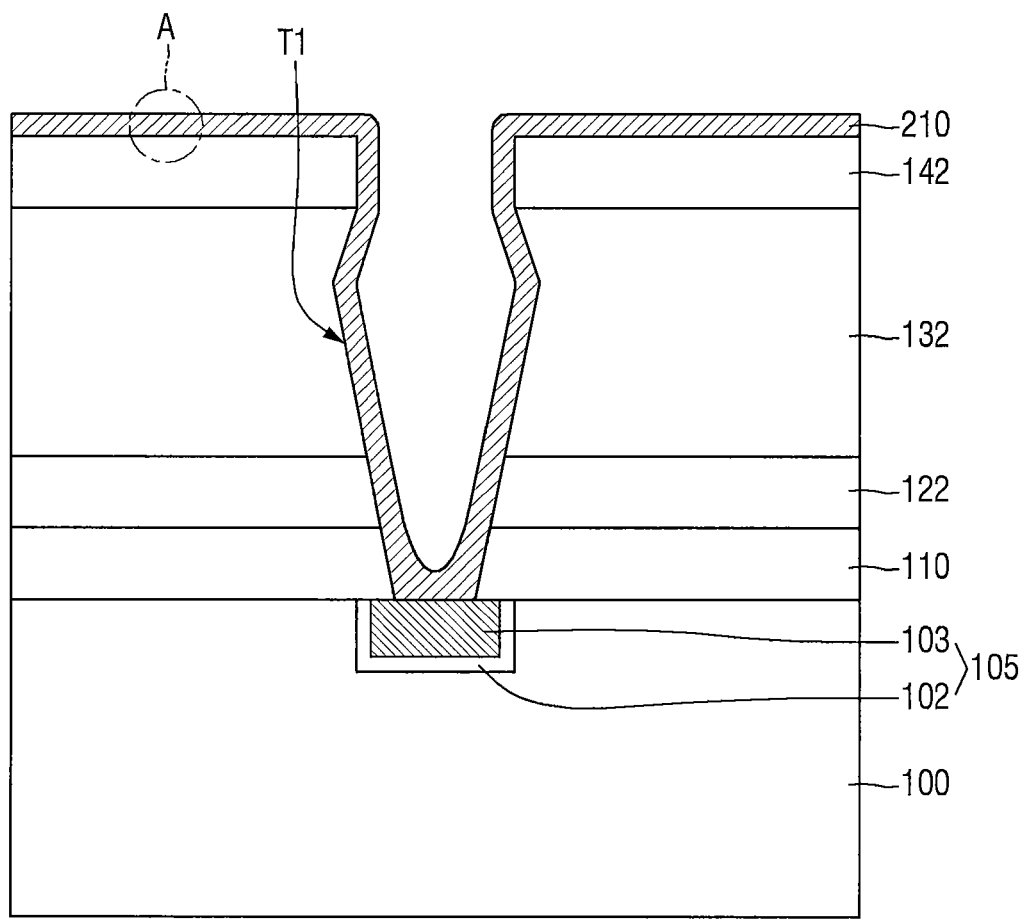
FIG. 7 is a cross-sectional view illustrating a process of forming a first metal film using a physical vapor deposition (PVD) process.
Figure 8:
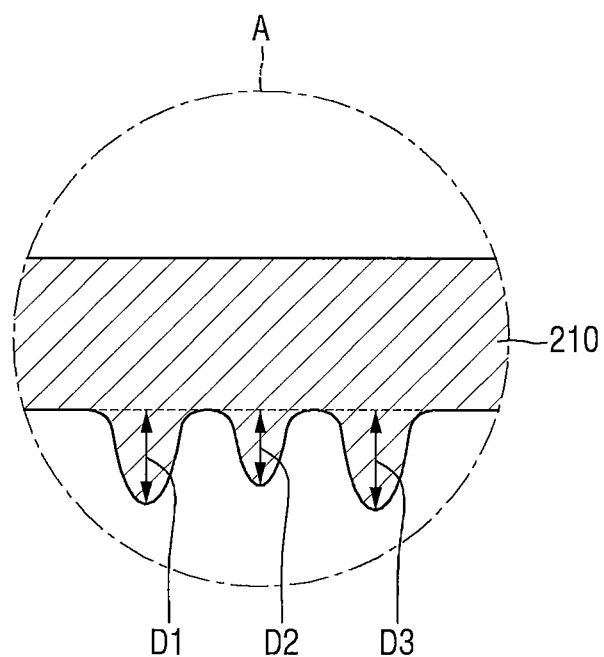
FIG. 8 is an enlarged view of region A of FIG. 7.
Figure 9:
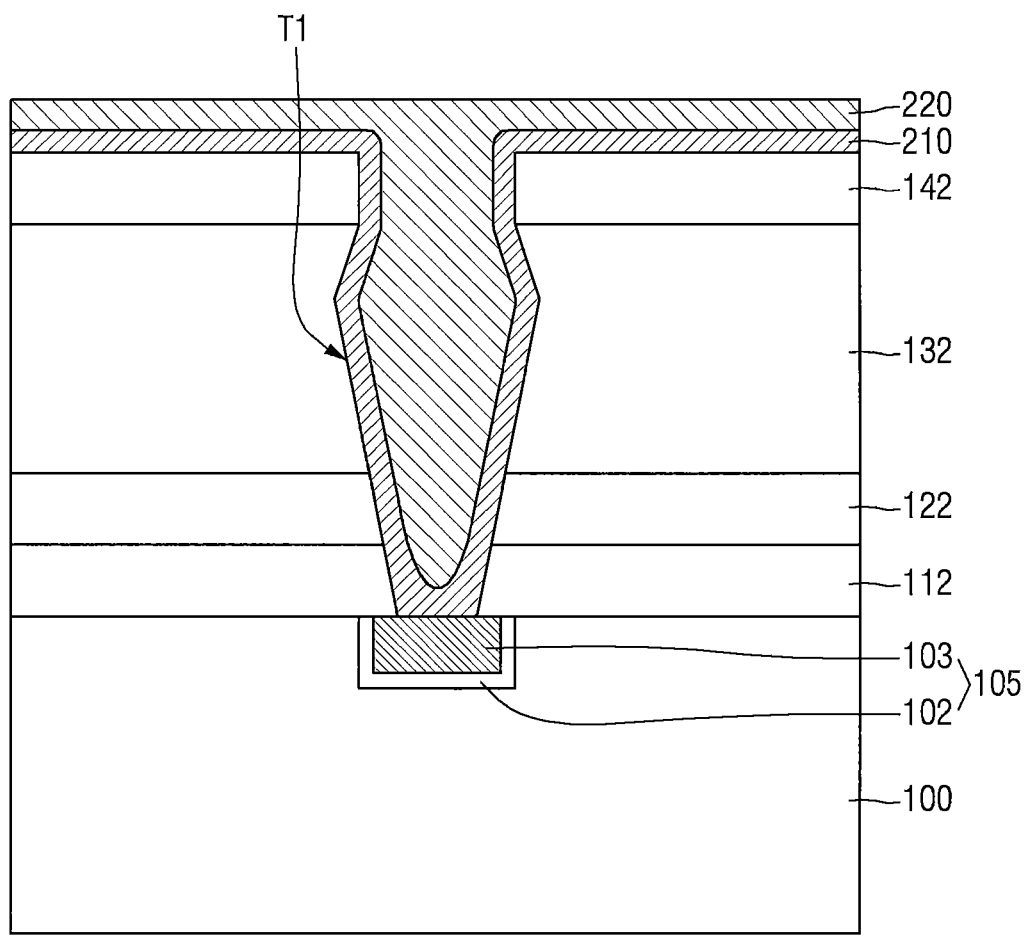
FIG. 9 is a cross-sectional view illustrating a process of forming a second metal film inside the via trench.
Figure 10:
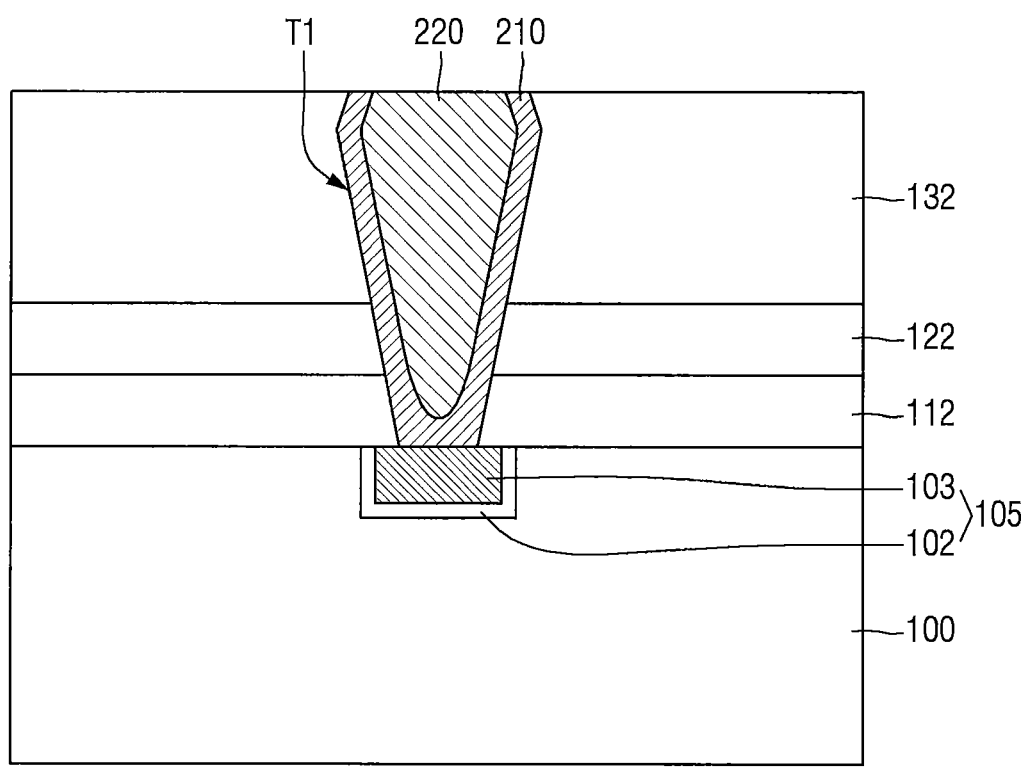
FIG. 10 is a cross-sectional view illustrating a process of forming an inter-metal dielectric (IMD) layer using a chemical mechanical polishing (CMP) process.

FIG. 7 is a cross-sectional view illustrating a process of forming a first metal film using a PVD process. FIG. 8 is an enlarged view of region A of FIG. 7. FIG. 9 is a cross-sectional view illustrating a process of forming a second metal film inside the via trench. FIG. 10 is a cross-sectional view illustrating a process of forming an IMD layer using a chemical mechanical polishing (CMP) process.

Referring to FIG. 7, a first metal film 210 may be formed in a via trench T1. For example, the first metal film 210 may be formed in the via trench T1 using a PVD process or the like. In a specific example, the first metal film 210 may be formed in the via trench T1 using a physical sputtering technique. The first metal film 210 may include a conductive material. For example, first metal film 210 may include TiN or TaN.

Referring to FIG. 8, in the process of forming the first metal film 210, part of the conductive material may penetrate a fourth interlayer insulating film 140. The fourth interlayer insulating film 140 may include a conductive material of which concentration decreases from top to bottom of the fourth interlayer insulating film 140. A penetrated extent of the conductive material may be defined as a penetrated depth based on the concentration of the conductive material. The penetrated depth may refer to a depth of an area having a critical concentration or higher. The penetrated extent of the conductive material may be measured based on a plurality of penetrated depths D1, D2, or D3. For example, the penetrated extent of the conductive material may be measured using an average of penetrated depths.

In the method of fabricating the semiconductor device according to some example embodiments of the present disclosure, a carbon concentration of the fourth interlayer insulating film 140 may be lower than that of the third interlayer insulating film 130. The fourth interlayer insulating film 140 may have a structure denser than that of the third interlayer insulating film 130. As compared with the third interlayer insulating film 130, the fourth interlayer insulating film 140 may prevent or reduce the penetration of particles of the conductive material, which are sputtered during the process of forming the first metal film 210.

In an example, when the fourth interlayer insulating film 140 is not used as a mask pattern 142, a depth to which TiN penetrates the third interlayer insulating film 130 may be 66 Å. In contrast, according to some example embodiments of the present disclosure, when the fourth interlayer insulating film 140 is used as the mask pattern 142, the depth to which TiN penetrates the fourth interlayer insulating film 140 may be 37 Å. That is, according to some example embodiments of the present disclosure, the fourth interlayer insulating film 140 may be used as the mask pattern 142 so that the penetrated depth of TiN may be reduced to 56% or less.

In another example, when the fourth interlayer insulating film 140 is not used as the mask pattern 142, a depth to which TaN penetrates the third interlayer insulating film 130 may be 3.4 nm. In contrast, according to some example embodiments of the present disclosure, when the fourth interlayer insulating film 140 is used as the mask pattern 142, the depth to which TaN penetrates the fourth interlayer insulating film 140 may be 2.6 Å. That is, according to some example embodiments of the present disclosure, the fourth interlayer insulating film 140 may be used as the mask pattern 142 so that the penetrated depth of TiN may be reduced to 76% or less.

Referring to FIG. 9, a second metal film 220 may be formed along an upper portion of the fourth interlayer insulating film 140 to fill the inside of the via trench T1. For example, the second metal film 220 may fill a space formed by the first metal film 210 inside the via trench T1. The second metal film 220 may include a conductive material.

For example, the second metal film 220 may include aluminum (Al), copper (Cu), tungsten (W), cobalt (Co), or a combination thereof.

Referring to FIG. 10, the mask pattern 142, a portion of a third interlayer insulating pattern 132, a portion of the first metal film 210, and a portion of the second metal film 220 may be removed using a CMP process.

As described above, since the mask pattern 142 is removed due to the CMP process, the third interlayer insulating film 130 and the fourth interlayer insulating film 140 may not be formed consecutively. Thus, a transition layer or a transition dielectric film may not be formed between the third interlayer insulating film 130 and the fourth interlayer insulating film 140. Therefore, a height of a final IMD layer may be reduced. The IMD layer may refer to an insulating layer configured to surround the via trench T1 after the CMP process described with reference to FIG. 10. That is, the IMD layer may include a first interlayer insulating pattern 112, a second interlayer insulating pattern 122, and a portion of the third interlayer insulating pattern 132. The height of the IMD layer may refer to a distance from a top surface of a substrate to a top surface of the third interlayer insulating pattern 132 that is obtained after the CMP process. In an example, the height of the IMD layer may be 1000 Å or less. In another example, the height of the IMD layer may be 500 Å or less. However, the present disclosure is not limited thereto.

While the present inventive concepts have been particularly shown and described with reference to example embodiments thereof, it will be understood by those of ordinary skill in the art that various changes in form and details may be made therein without departing from the scope of the present inventive concepts as defined by the following claims. It is therefore desired that the present embodiments be considered in all respects as illustrative and not restrictive, reference being made to the appended claims rather than the foregoing description to indicate the scope of the present disclosure.

What is claimed is:

1. A method of fabricating a semiconductor device, the method comprising:
    forming a first interlayer insulating film on a substrate, the first interlayer insulating film including a first atomic ratio of carbon;
    forming a second interlayer insulating film on the first interlayer insulating film, the second interlayer insulating film including a second atomic ratio of carbon that is higher than the first atomic ratio;
    forming a third interlayer insulating film on the second interlayer insulating film, the third interlayer insulating film including a third atomic ratio of carbon that is higher than the first atomic ratio and lower than the second atomic ratio;
    removing a portion of the third interlayer insulating film and forming a mask pattern that exposes a portion of the second interlayer insulating film;
    forming a via trench using the mask pattern, the via trench extending at least partially into the first interlayer insulating film and the second interlayer insulating film; and
    forming a via filling the via trench,
    wherein the forming the second interlayer insulating film and forming the third interlayer insulating film are separated by a rest interval such that there is a discontinuous boundary between the second interlayer insulating film and the third interlayer insulating film.

2. The method of claim 1, wherein the first atomic ratio ranges from 0% to 2%, wherein the second atomic ratio ranges from 15% to 17%, and wherein the third atomic ratio ranges from 10% to 12%.

3. The method of claim 1, wherein the second interlayer insulating film and third interlayer insulating film have substantially equal refractive indices.

4. The method of claim 1, wherein a k value of the third interlayer insulating film is between a k value of the first interlayer insulating film and a k value of the second interlayer insulating film.

5. The method of claim 1, wherein the forming of the first interlayer insulating film is performed using a dual frequency plasma generator having a first ratio of high-frequency power to low-frequency power.

6. The method of claim 5, wherein the forming of the second interlayer insulating film is performed using the dual frequency plasma generator having a second ratio of high-frequency power to low-frequency power that is greater than the first ratio of high-frequency power to low-frequency power.

7. The method of claim 6, wherein the forming of the third interlayer insulating film is performed using the dual frequency plasma generator having a third ratio of high-frequency power to low-frequency power that is less than the second ratio of high-frequency power to low-frequency power.

8. The method of claim 1, wherein the first interlayer insulating film has a first thickness, wherein the second interlayer insulating film has a second thickness greater than the first thickness, and wherein the third interlayer insulating film has a third thickness greater than the first thickness and the second thickness.

9. The method of claim 1, wherein the forming of the first to third interlayer insulating films is performed in-situ.

10. The method of claim 1, wherein forming the via comprises:
    forming a first metal film including titanium nitride (TiN) or tantalum nitride (TaN) in a first portion of the via trench; and
    forming a second metal film in a remaining portion of the via trench.

11. The method of claim 1, further comprising forming a fourth interlayer insulating film between the first interlayer insulating film and the second interlayer insulating film, wherein a ratio of carbon included in the fourth interlayer insulating film is continuously changed from the first atomic ratio to the second atomic ratio over a thickness of the fourth interlayer insulating film.

12. A method of fabricating a semiconductor device, the method comprising:
    forming a first interlayer insulating film on a substrate using a first process for providing a carbon precursor having a first precursor ratio and oxygen (O2);
    forming a second interlayer insulating film on the first interlayer insulating film using a second process for providing oxygen and a carbon precursor having a second precursor ratio that is higher than the first precursor ratio;
    forming a third interlayer insulating film on the second interlayer insulating film using a third process for providing oxygen and a carbon precursor having a third precursor ratio that is lower than the second precursor ratio;
    removing a portion of the third interlayer insulating film and forming a mask pattern that exposes at least a portion of the second interlayer insulating film;

forming a via trench using the mask pattern, the via trench extending at least partially into the first interlayer insulating film and the second interlayer insulating film; and forming a via filling the via trench, wherein each of the first to third precursor ratios is a ratio of the carbon precursor to oxygen, wherein the carbon precursor is supplied into a reaction chamber between the first process and the second process, and wherein an interruption of supplying carbon precursor into the reaction chamber occurs between the second process and the third process.

13. The method of claim 12, wherein the carbon precursor comprises octa-methyl-cyclotetrasioxane (OMCTS).

14. The method of claim 12, wherein the first precursor ratio is within a first range, wherein the second precursor ratio is in a second range greater than the first range, and wherein the third precursor ratio is in a third range between the first and second ranges.

15. The method of claim 14, further comprising forming a fourth interlayer insulating film between the first interlayer insulating film and the second interlayer insulating film using a continuously changing precursor ratio starting in the first range and ending in the second range.

16. The method of claim 12, wherein the interruption occurs over a time interval, and wherein during a portion of the time interval low frequency power is supplied to a plasma generator such that carbon precursor remaining in the reaction chamber is deposited as part of the second interlayer insulating film.

17. A method of fabricating a semiconductor device, the method comprising:

forming a first interlayer insulating film on a substrate, the first interlayer insulating film including a first bond ratio of silicon-methyl (Si—CH3) bonds to silicon-oxygen (Si—O) bonds;

forming a second interlayer insulating film on the first interlayer insulating film, the second interlayer insulating film including a second bond ratio of Si—CH3 bonds to Si—O bonds that is higher than the first bond ratio;

forming a third interlayer insulating film on the second interlayer insulating film, the third interlayer insulating film including a third bond ratio of Si—CH3 bonds to Si—O bonds that is between than the first bond ratio and the second bond ratio;

removing a portion of the third interlayer insulating film and forming a mask pattern that exposes at least a portion of the second interlayer insulating film;

forming a via trench using the mask pattern, the via trench extending at least partially into the first interlayer insulating film and the second interlayer insulating film; and forming a via filling the via trench, wherein the second bond ratio included in the second interlayer insulating film is discontinuous with the third bond ratio included in the third interlayer insulating film at a boundary between the second interlayer insulating film and the third interlayer insulating film.

18. The method of claim 17, wherein the first bond ratio ranges from 1.05% to 1.15%, wherein the second bond ratio ranges from 3.52% to 3.62%, and wherein the third bond ratio ranges from 1.45% to 1.55%.

19. The method of claim 17, further comprising forming a fourth interlayer insulating film between the first interlayer insulating film and the second interlayer insulating film, wherein the fourth interlayer insulating film has a variable bond ratio of Si—CH3 bonds to Si—O bonds.

20. The method of claim 19, wherein a bond ratio of a first portion of the fourth interlayer insulating film that is closer to the second interlayer insulating film is greater than a bond ratio of a second portion of the fourth interlayer insulating film that is closer to the first interlayer insulating film.

* * * * *